(12) United States Patent
Pan

(10) Patent No.: US 11,282,558 B2
(45) Date of Patent: Mar. 22, 2022

(54) FERROELECTRIC RANDOM-ACCESS MEMORY WITH ROMFUSE AREA HAVING REDUNDANT CONFIGURATION WORDLINES

(71) Applicant: Wuxi Petabyte Technologies Co., Ltd., Wuxi (CN)

(72) Inventor: Feng Pan, Fremont, CA (US)

(73) Assignee: WUXI PETABYTE TECHNOLOGIES CO., LTD., Jiangsu (CN)

( * ) Notice: Subject to any disclaimer, the term of this patent is extended or adjusted under 35 U.S.C. 154(b) by 0 days.

(21) Appl. No.: 16/880,902

(22) Filed: May 21, 2020

(65) Prior Publication Data

US 2021/0366530 A1 Nov. 25, 2021

(51) Int. Cl.
G11C 11/22 (2006.01)

(52) U.S. Cl.
CPC ...... *G11C 11/2273* (2013.01); *G11C 11/2257* (2013.01); *G11C 11/2277* (2013.01)

(58) Field of Classification Search
CPC ............ G11C 11/2273; G11C 11/2277; G11C 11/2257
See application file for complete search history.

(56) References Cited

U.S. PATENT DOCUMENTS

| | | | |
|---|---|---|---|
| 7,248,514 B2 * | 7/2007 | Nishihara | G11C 29/44 365/200 |
| 9,627,077 B2 | 4/2017 | Shirakawa | |
| 2004/0143710 A1 * | 7/2004 | Walmsley | B41J 2/04508 711/144 |
| 2009/0248955 A1 | 10/2009 | Tamada | |
| 2012/0195144 A1 * | 8/2012 | Ide | H01L 27/10844 365/200 |
| 2014/0192583 A1 * | 7/2014 | Rajan | G11C 5/06 365/63 |
| 2019/0295669 A1 | 9/2019 | Yang et al. | |

* cited by examiner

*Primary Examiner* — Sultana Begum
(74) *Attorney, Agent, or Firm* — Bayes PLLC

(57) ABSTRACT

Embodiments of the present disclosure relate to an architecture for random access memory (RAM) circuit configurations. For example, certain embodiments relate to a ferroelectric RAM (FRAM) read only memory (ROM) wordline architecture. A method for power-on reset of a memory can include powering on the memory. The method can also include reading a first flag in a first bit of a first configuration wordline of the memory, wherein the first configuration wordline is one of a plurality of redundant configuration wordlines. The method can further include reading, when the first flag indicates the first configuration wordline is valid, a predetermined number of bytes of the wordline. The method can additionally include configuring operations of the memory based on the predetermined number of bytes, when the first flag indicates the first configuration wordline is valid.

26 Claims, 6 Drawing Sheets

FERROELECTRIC RANDOM-ACCESS MEMORY WITH ROMFUSE AREA HAVING REDUNDANT CONFIGURATION WORDLINES

BACKGROUND

Embodiments of the present disclosure relate to an architecture for random access memory (RAM) circuit configurations. For example, certain embodiments relate to a ferroelectric RAM (FRAM) read only memory (ROM) wordline architecture.

A FRAM device may include a ROM wordline, which may contain ROMFUSE data. For example, ROMFUSE data can include configuration bit information and analog trimming parameters. The ROMFUSE data can be transferred to a Flip-Flop/Latch/Registers in the periphery for circuits to use after power up of a memory device. The ROM wordline including the ROMFUSE data can be a region where information unique to the individual FRAM device is retained, and access from the outside is prohibited. Thus, for example, the ROM wordline may not be addressable by processes or applications running on a processor of a host device that is equipped with the FRAM device. Instead, the ROM wordline containing ROMFUSE data may be reserved for configuration of the FRAM device.

SUMMARY

Embodiments of a FRAM ROM wordline architecture are disclosed herein.

According to one aspect of the present disclosure, a method for power-on reset of a memory can include powering on the memory. The method can also include reading a first flag in a first bit of a first configuration wordline of the memory, wherein the first configuration wordline is one of a plurality of redundant configuration wordlines. The method can further include reading, when the first flag indicates the first configuration wordline is valid, a predetermined number of bytes of the wordline. The method can additionally include configuring operations of the memory based on the predetermined number of bytes, when the first flag indicates the first configuration wordline is valid.

In some embodiments, the method can further include reading, when the first flag indicates the first configuration wordline is invalid, a second flag in a first bit of a second configuration wordline of the memory. The second configuration wordline can also be one of the plurality of redundant configuration wordlines.

In some embodiments, the method can further include reading, when the second flag indicates the second configuration wordline is valid, a predetermined number of bytes of the wordline, and configuring operations of the memory based on the predetermined number of bytes, when the second flag indicates the second configuration wordline is valid.

In some embodiments, the method can further include reading, when the second flag indicates the second configuration wordline is invalid, a third flag in a first bit of a third configuration wordline of the memory. The third configuration wordline can also be one of the plurality of redundant configuration wordlines.

In some embodiments, a plurality of flags following the first flag can be consecutively read until a flag indicating that a corresponding configuration wordline is valid.

In some embodiments, the first configuration wordline can include a ROMFUSE wordline.

In some embodiments, the reading a predetermined number of bytes can include reading four bytes at a time, five times.

In some embodiments, the predetermined number of bytes comprises 1 bit for the flag, 3 bits for device user configuration, 3 bits for logic wordline enable 1 ns delay option, 88 bits for analog and array design option, 64 bits for redundancy content addressable memory, and 1 bit designated as unused.

In some embodiments, the memory comprises a plurality of sectors each having a plurality of sub-arrays. Each sub-array can include a respective one of the plurality of redundant configuration wordlines.

In some embodiments, the memory can include one of the plurality of redundant configuration wordlines per 512 wordlines.

According to another aspect of the present disclosure, a memory device can include a controller configured to control operation of a memory. The memory device can also include the memory, which can include a plurality of redundant configuration wordlines. The controller can be configured to read a first flag in a first bit of a first configuration wordline of the memory. The first configuration wordline can be one of the plurality of redundant configuration wordlines. The controller can also be configured to read, when the first flag indicates the first configuration wordline is valid, a predetermined number of bytes of the wordline. The controller can further be configured to configure operations of the memory based on the predetermined number of bytes, when the first flag indicates the first configuration wordline is valid.

In some embodiments, the controller can be further configured to read, when the first flag indicates the first configuration wordline is invalid, a second flag in a first bit of a second configuration wordline of the memory. The second configuration wordline can also be one of the plurality of redundant configuration wordlines.

In some embodiments, the controller can be further configured to read, when the second flag indicates the second configuration wordline is valid, a predetermined number of bytes of the wordline and to configure operations of the memory based on the predetermined number of bytes, when the second flag indicates the second configuration wordline is valid.

In some embodiments, the controller can be further configured to read, when the second flag indicates the second configuration wordline is invalid, a third flag in a first bit of a third configuration wordline of the memory. The third configuration wordline can also be one of the plurality of redundant configuration wordlines.

In some embodiments, the controller can be configured to read a plurality of flags following the first flag consecutively until a flag indicating that a corresponding configuration wordline is valid.

In some embodiments, the first configuration wordline can be a ROMFUSE wordline.

In some embodiments, the controller can be configured to read the predetermined number of bytes by reading four bytes at a time, five times.

In some embodiments, the predetermined number of bytes can include 1 bit for the flag, 3 bits for device user configuration, 3 bits for logic wordline enable 1 ns delay option, 88 bits for analog and array design option, 64 bits for redundancy content addressable memory, and 1 bit designated as unused.

In some embodiments, the memory can include a plurality of sectors each having a plurality of sub-arrays. Each sub-array can include a respective one of the plurality of redundant configuration wordlines.

In some embodiments, the memory can include one of the plurality of redundant configuration wordlines per 512 wordlines.

According to a further aspect of the disclosure, a memory controller can include a digital logic circuit configured to control operation of a memory. The digital logic circuit may be configured to read a first flag in a first bit of a first configuration wordline of the memory. The first configuration wordline may be one of the plurality of redundant configuration wordlines. The digital logic circuit may also be configured to read, when the first flag indicates the first configuration wordline is valid, a predetermined number of bytes of the wordline. The digital logic circuit may further be configured to configure operations of the memory based on the predetermined number of bytes, when the first flag indicates the first configuration wordline is valid.

In some embodiments, the digital logic circuit may further be configured to read, when the first flag indicates the first configuration wordline is invalid, a second flag in a first bit of a second configuration wordline of the memory, wherein the second configuration wordline is also one of the plurality of redundant configuration wordlines.

In some embodiments, the digital logic circuit may further be configured to read, when the second flag indicates the second configuration wordline is valid, a predetermined number of bytes of the wordline. The digital logic circuit may also be configured to configure operations of the memory based on the predetermined number of bytes, when the second flag indicates the first configuration wordline is valid.

In some embodiments, the digital logic circuit may further be configured to read, when the second flag indicates the second configuration wordline is invalid, a third flag in a first bit of a third configuration wordline of the memory, wherein the third configuration wordline is also one of the plurality of redundant configuration wordlines.

In some embodiments, the digital logic circuit may be configured to read a plurality of flags following the first flag consecutively until a flag indicating that a corresponding configuration wordline is valid.

In some embodiments, the first configuration wordline may be a ROMFUSE wordline.

In some embodiments, the digital logic circuit may be configured to read the predetermined number of bytes by reading four bytes at a time, five times.

In some embodiments, the predetermined number of bytes may include 1 bit for the flag, 3 bits for device user configuration, 3 bits for logic wordline enable 1 ns delay option, 88 bits for analog and array design option, 64 bits for redundancy content addressable memory, and 1 bit designated as unused.

In some embodiments, the memory may include a plurality of sectors each having a plurality of sub-arrays, wherein each sub-array comprises a respective one of the plurality of redundant configuration wordlines.

In some embodiments, the memory may include one of the plurality of redundant configuration wordlines per 512 wordlines.

According to an additional aspect, a data structure can be embodied in a non-transitory computer-readable medium. The structure can include a plurality of sectors in the non-transitory computer-readable medium. Each of the plurality of sectors can include a plurality of sub-arrays of a corresponding sector. Each sub-array of the plurality of sub-arrays can include a respective one of a plurality of redundant configuration wordlines for the corresponding sector.

In some embodiments, the plurality of redundant configuration wordlines comprise one respective configuration wordline per 512 wordlines.

In some embodiments, each redundant configuration wordline of the plurality of redundant configuration wordlines comprises a validity flag out of a predetermined number of bits.

In some embodiments, the predetermined number of bytes comprise 1 bit for the flag, 3 bits for device user configuration, 3 bits for logic wordline enable 1 ns delay option, 88 bits for analog and array design option, 64 bits for redundancy content addressable memory, and 1 bit designated as unused.

In some embodiments, the plurality of redundant configuration wordlines respectively comprise eight identical copies of configuration information for the operation of the non-transitory computer-readable medium.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Certain embodiments of the present disclosure avoid the above-identified issues and provide various benefits and/or advantages. For example, certain embodiments may provide a reliable and efficient way to ensure yield while guaranteeing that necessary configuration information is preserved.

Figure 1:
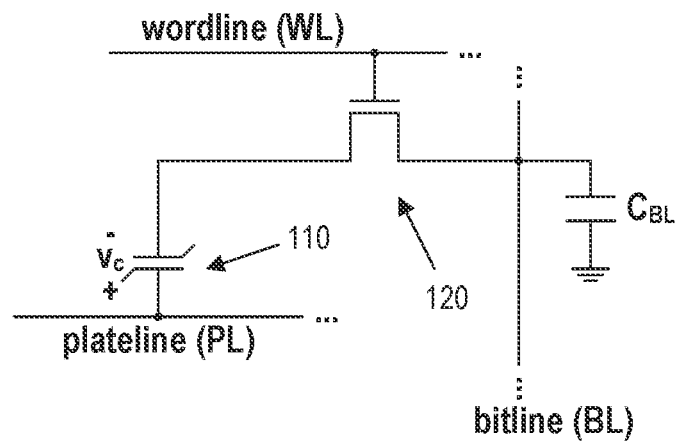
FIG. 1 illustrates an FRAM circuit according to certain embodiments.

FIG. 1 illustrates an FRAM circuit according to certain embodiments. As shown in FIG. 1, a bit can be stored as a voltage polarity of capacitor 110, having a voltage of $V_c$. Capacitor 110 is typically made from a film of ferroelectric material placed between two electrodes, which is why it is referred to as ferroelectric RAM. There can be a corresponding transistor 120 associated with capacitor 110. The voltage polarization stored in capacitor 110 persists even after the electric field producing the voltage has been removed. This is the reason this device is used for storing bits. Unlike some other forms of bit storage, the read process of the bit stored in capacitor 110 is destructive. The capacitor $C_{BL}$ is a circuit element representative of a total parasitic capacitance of the BL.

To determine the polarity of capacitor 110, both the wordline (WL) and the plateline (PL), sometimes referred to as a drive line, can be brought high. A sensing amplifier (not shown) can then be used to evaluate whether the voltage provided on the BL is above or below a threshold reference voltage. If the voltage is above the reference voltage, the BL can be driven to high, whereas if the voltage is below the reference voltage, the BL can be driven to low. The driving of the BL to high or low can be used to restore the polarity in the capacitor.

Figure 2:
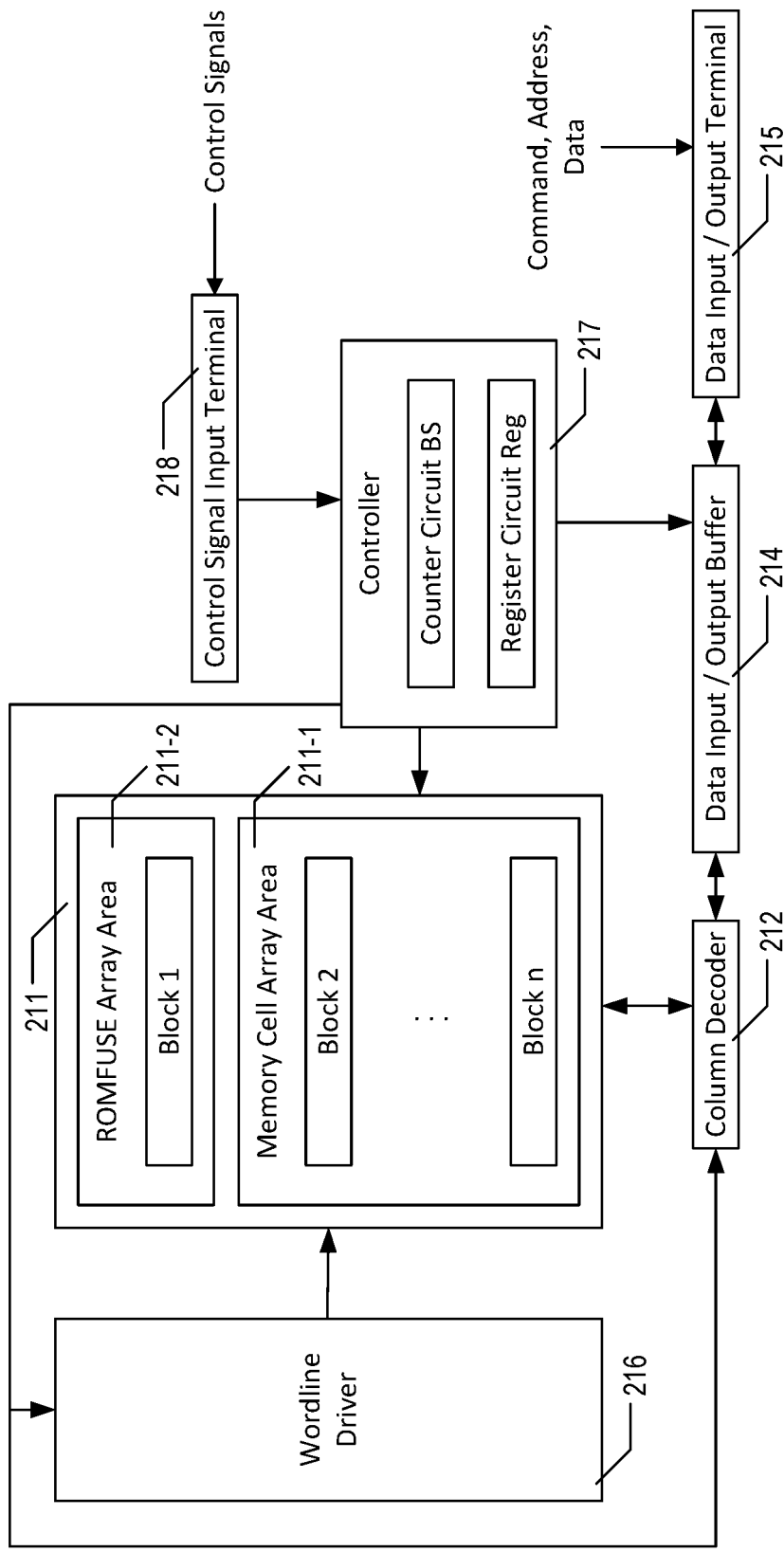
FIG. 2 illustrates a background configuration of an FRAM.

FIG. 2 illustrates a background configuration of an FRAM. As shown in FIG. 2, an example FRAM can include a memory cell array 211, column decoder 212, data input/output buffer 214, data input/output terminal 215, word line driver 216, controller 217, and control signal input terminal 218. Controller 217 may be implemented as a digital logic circuit.

The memory cell array 211 can be divided into a memory cell array area 211-1 and ROMFUSE array area 211-2, and can include multiple blocks (block 1 to block n). Each of the plurality of blocks (block 1 to block n) includes a plurality of memory cells arranged in a matrix at the intersections of a plurality of word lines and a plurality of bit lines. The memory cell array 211 is electrically connected to the word line driver 216 for controlling the word lines, the column decoder 212 for controlling the bit lines, and the controller 217. The memory cell array area 211-1 of this example includes multiple blocks (block 2 to block n), and can be used to write, read, and erase general data such as user data.

The ROMFUSE array area 211-2 of this example includes a ROMFUSE block (block 1). The ROMFUSE block can record information for optimizing the initial circuit settings of the fabricated FRAM chip in accordance with the variations in circuit operations caused by the fabrication conditions of the chip, and replacing a defective column or block with a good column or block (redundancy), parameters pertaining to a read level (Vr0), and the like. The information, parameters, and the like may be read out from the ROMFUSE block when the power supply is turned on, loaded into a register circuit Reg of the controller 217, and used to optimize the operation of the FRAM.

The column decoder 212 can read out data from a memory cell in the memory cell array 211 using a bit line and can detect the state of the memory cell in the memory cell array 211 via the bit line. The column decoder 212 can write data in a memory cell of the memory cell array 211 by applying a write control voltage to the memory cell via a bit line under the control of the controller 217. The column decoder 212 can be connected to the data input/output buffer 214.

Memory cell data selected and read out by the column decoder 212 can be output from the data input/output terminal 215 using the data input/output buffer 214. The data input/output terminal 215 can be connected to an external memory controller, host apparatus, or the like.

The host apparatus, such as a micro-computer, can receive readout data output from the data input/output terminal 215. In addition, the host apparatus can output various commands (Command) for controlling the operation of the FRAM, addresses (Address), and write data (Data). The write data input from the host apparatus to the data input/output terminal 215 can be supplied to a selected data storage circuit (not shown) in the column decoder 212 via the data input/output buffer 214. The various commands (Command) and addresses (Address) can be supplied to the controller 217.

The word line driver 216 can select a word line in the memory cell array 211, and can apply a necessary voltage for data read, write, or erase to the selected word line.

The controller 217 can include the register circuit Reg and a counter circuit BS, and can apply necessary control signals and control voltages to electrically connected circuits. The controller 217 can be electrically connected to the memory cell array 211, column decoder 212, data input/output buffer 214, and word line driver 216, and can control the connected circuits. The controller 217 can be connected to the control signal input terminal 218, and controlled by control signals such as an Address Latch Enable (ALE) signal input from the host apparatus via the control signal input terminal 218. The controller 217 may also include such additional elements as an internal voltage generator, and may supply control voltages necessary for the operations of the connected circuits described above.

The register circuit Reg may store information such as redundancy information pertaining to parameters read out from the ROMFUSE block (BLOCK 1) when the power supply is turned on in the data refresh operation.

The counter circuit (also called the bit scan circuit) BS can be configured to count, for example, the number of data "0" (the number of differences between first readout data and second readout data) (N) of data stored in a third data latch circuit DL3, in one step of a data refresh control operation.

The column decoder 212, data input/output buffer 214, word line driver 216, and controller 217 can form a write circuit, read circuit, and erase circuit.

Figure 3:
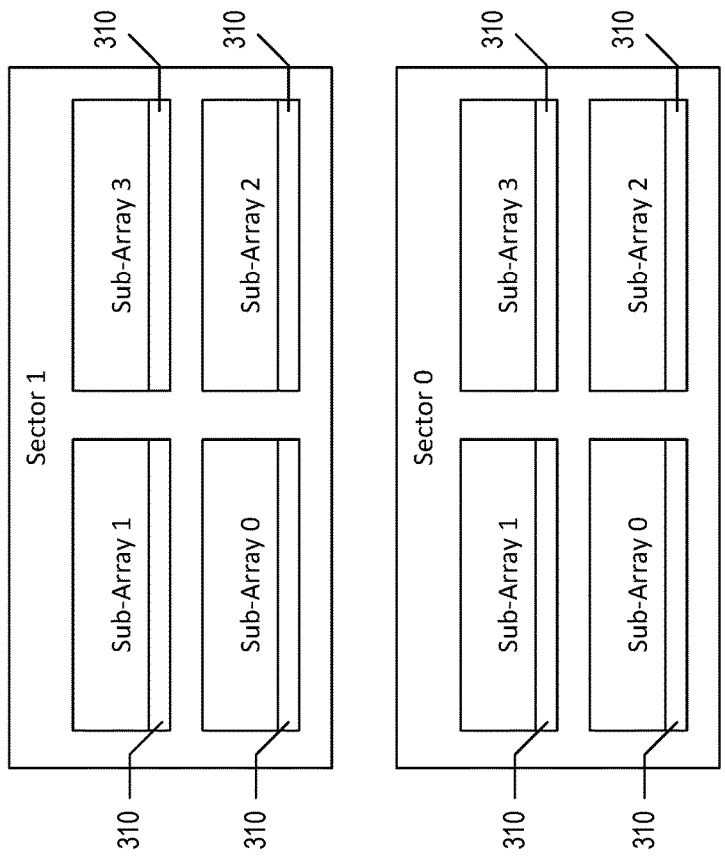
FIG. 3 illustrates an arrangement of FRAM ROM wordlines, according to certain embodiments.

FIG. 3 illustrates an arrangement of FRAM ROM wordlines, according to certain embodiments. As shown in FIG. 3, a memory 300 may include multiple sectors, such as Sector 0, Sector 1, and so on. Each sector may include multiple sub-arrays, such as sub-array 0, sub-array 1, sub-array 2, and sub-array 3. Each sub-array may include a predetermined number of wordlines, such as 512 wordlines.

Each sub-array can include one ROM wordline containing ROMFUSE data 310 per 512 wordlines. Other ratios are also permitted, though a 1/512 ratio is provided as an example.

In contrast to the approach of FIG. 2, in FIG. 3 a given sub-array of memory 300 may include 128 kilobits (kb) and may have one physical ROM wordline (ROMWL). Each ROMWL may have 1000 physical bitlines and may be capable of storing 512 Fuse data, namely 16×4-byte fuse bits.

Certain embodiments may provide chip testing data using 160 fuse data, namely 5×4-byte fuse bits. The following may be the usage of the 160 bits: 1 bit for a ROMWL flag; 3 bits for device user configuration; 3 bits for logic wordline 1 enable (WLEN1) 1 ns delay option; 88 bits for analog and array design option; 64 bits for redundancy content addressable memory (CAM); and 1 designated as unused. Even with the 64 bits for CAM, 56 bits may be used in practice, with a full 8 bytes (64 bits) assigned for easy control. In this way, exactly 160 bits may be used or reserved for test chip data for each ROMWL.

Figure 4:
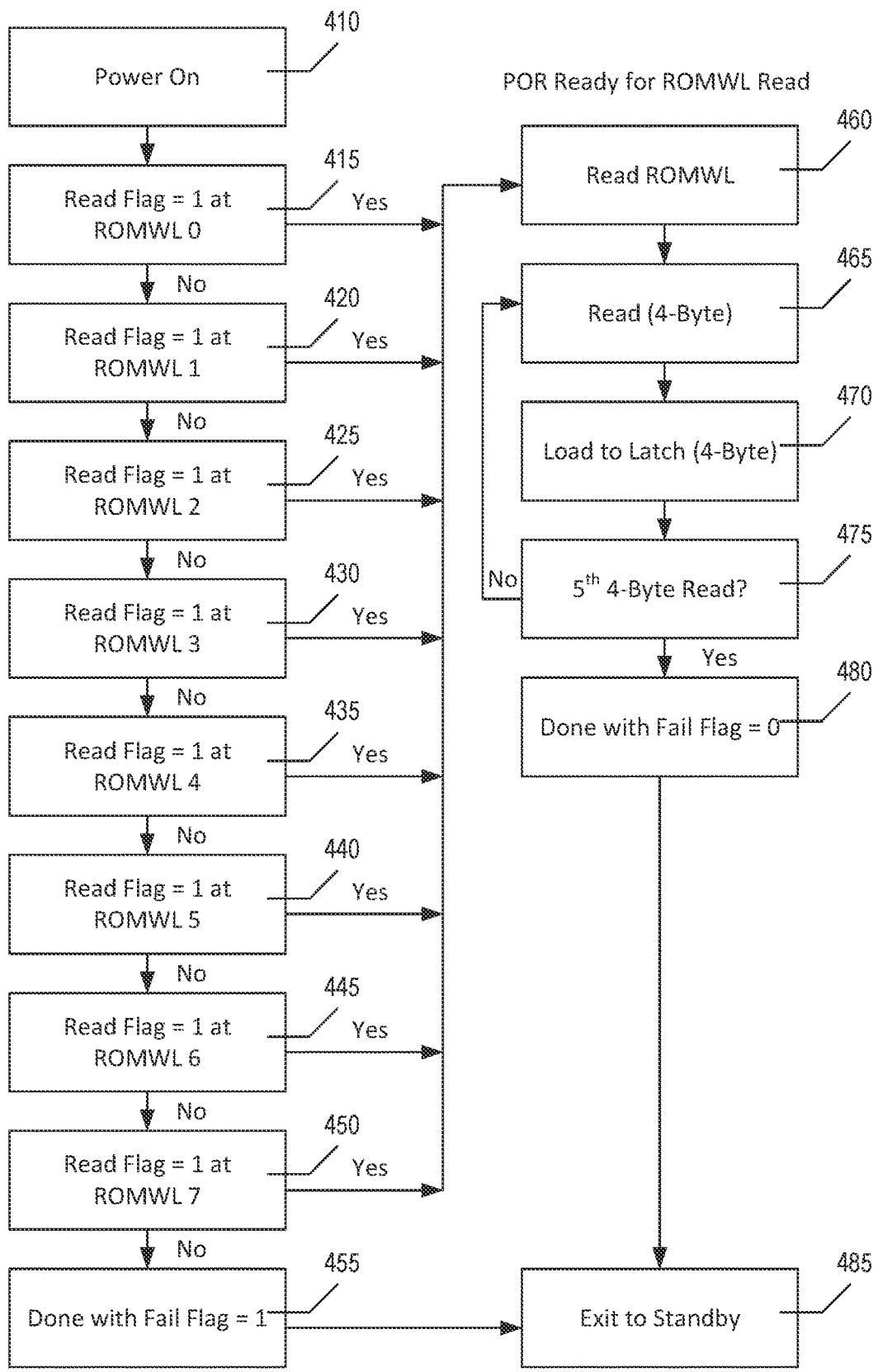
FIG. 4 illustrates a power-on reset (POR) procedure, according to certain embodiments.

FIG. 4 illustrates a power-on reset (POR) procedure, according to certain embodiments. During a POR procedure, the system may seek to read the ROM data recorded in the FRAM ROM wordlines. In this example, there may be up to eight copies of the same information, recorded at ROMWL 0, ROMWL 1, ROMWL 2, ROMWL 3, ROMWL 4, ROMWL 5, ROMWL 6, and ROMWL 7, respectively. One reason for providing so many copies may be to provide redundancy. Accordingly, as mentioned with reference to FIG. 3, a first bit of each ROMWL may be a ROMWL flag. This flag may be used as an indication of the validity of the ROMWL information. If the flag is 0, the ROMWL information that follows is not to be used. If the flag is 1, the ROMWL information that follows can be used. For the validity identification of ROMWL, one bit can be used as in this example, or a certain predefined pattern could be used as another alternative.

As shown in FIG. 4, a POR procedure can begin at power on 410. This power on 410 may be accomplished by providing power from a power source, such as a battery of a mobile device, to a memory. Then, at 415, the system can read to check whether the ROMWL flag is 1 for ROMWL 0. This can be the first configuration wordline of the memory, out of a plurality of redundant configuration wordlines. The ROMWL flag can be in a first bit of ROMWL 0. If the ROMWL flag for ROMWL 0 is 1, then the method can proceed to reading ROMWL 0 at 460. If the ROMWL flag for ROMWL 0 is not 1, then the method can proceed to the next wordline. Each of the ROMWLs can be similarly constructed to one another, and each can be considered one of the plurality of redundant configuration wordlines.

At 420, the system can read to check whether the ROMWL flag is 1 for ROMWL 1. If so, then the method can proceed to reading ROMWL 1 at 460. If not, then the method can proceed to the next wordline. Accordingly, at 425, the system can read to check whether the ROMWL flag is 1 for ROMWL 2. If so, then the method can proceed to reading ROMWL 2 at 460. If not, then the method can proceed to the next wordline. Accordingly, at 430, the system can read to check whether the ROMWL flag is 1 for ROMWL 3. If so, then the method can proceed to reading ROMWL 3 at 460. If not, then the method can proceed to the next wordline. Accordingly, at 435, the system can read to check whether the ROMWL flag is 1 for ROMWL 4. If so, then the method can proceed to reading ROMWL 4 at 460. If not, then the method can proceed to the next wordline. Accordingly, at 440, the system can read to check whether the ROMWL flag is 1 for ROMWL 5. If so, then the method can proceed to reading ROMWL 5 at 460. If not, then the method can proceed to the next wordline. Accordingly, at 445, the system can read to check whether the ROMWL flag is 1 for ROMWL 6. If so, then the method can proceed to reading ROMWL 6 at 460. If not, then the method can proceed to the next wordline. Accordingly, at 450, the system can read to check whether the ROMWL flag is 1 for ROMWL 7. If so, then the method can proceed to reading ROMWL 7 at 460. If not, then, in this example, the last ROMWL has been checked and all have had a negative indication. Therefore, at 455, the checking can end with a fail flag set to 1. Finally, at 485, the method can exit to standby at 485. Thus, the system can consecutively read each of the flags until finding a flag that indicates that the data in the corresponding wordline is valid. If none are valid, then the process can terminate without loading the configuration information.

As mentioned above, whenever a ROMWL flag is 1, the method can proceed to reading the corresponding ROMWL at 460, because the system can make a determination, implicitly or explicitly, that POR is ready for ROMWL reading. Thus, at 465, a four-byte portion of the ROMWL. The system can then, at 470, load to latch the four-byte section. At 475, the system can determine whether the section is the fifth such a four-byte section. If not, the system can increment a latch counter (not shown) and can return to 465 to read the next four-byte section.

The reason why there is a check for whether the fifth four-byte section has been read is that in certain embodiments there may be 160 bits to read, corresponding to 5×4-byte sections, as explained above. When the fifth four-byte section has been read, the system may, at 480, determine that the reading has been completed with the fail flag set to 0. The system may then exit the procedure to standby at 485.

Operations of the memory can be configured based on the twenty bytes read from the ROMWL. For example, various options can be enabled or disabled, and content can be identified as addressable or not, based on the contents of the ROMWL. Broadly speaking, any of the configuration information needed for the memory may be provided in the ROMWL, if desired. The data obtained can be loaded into a register, as discussed above with reference to FIG. 2.

The system to implement certain embodiments can be variously constructed. For example, although the memory may be configured as in FIG. 3, the controller and related circuits may be configured as shown in FIG. 2. Other implementations are also possible. For example, multiple controllers can operate in coordination and the needed registers may be stored in another location. The controller may be any suitable circuit, such as an application specific integrated circuit (ASIC). The controller may be on a different chip from the memory, and may read the ROMWL information through interconnects and/or interfaces to a memory chip of the memory. Alternatively, the controller may be on the same chip with the memory.

In certain embodiments, the ROMFUSE wordline information is reviewed using a screening test. The flag is, therefore, set based on the result of the screening test. Eight ROMFUSE wordlines can provide redundancy to ensure the yield of at least one successful set of POR information.

In certain embodiments, as explained above, a flag set to zero can indicate that the POR in that ROMFUSE wordline is not valid. Consequently, the system can skip reading the values of that wordline. On the other hand, a ROMWL flag set to one can indicate that proper POR information has been programmed into the corresponding ROMFUSE WL. Direct reading of the current ROMFUSE WL and loading of periphery configuration registers can be executed.

The flag for the ROMFUSE WL may be set based on a screening test. The reason for having eight ROMFUSE WLs may be to guarantee yield and successful POR information. In the examples described here, a ROMWL flag with a zero value means that the system is to bypass the corresponding ROMFUSE WL, because the information is not deemed valid. On the other hand, in this example, a ROMFUSE flag of one can mean that proper POR information is programmed to the current ROMFUSE wordline. Direct reading of the current ROMFUSE wordline and loading of periphery configuration registers can be executed. No additional error correction code (ECC) is needed in certain embodiments because, for example, the use of multiple copies of the identical information can ensure that at least one copy will be readable. The only situation in which reading fails may be when all copies of the information are invalid, such as when we all ROMWL flags are set to zero. If all ROMWL flags are set to zero, then the chip can be considered a bad die. Otherwise, proper configuration information should be readable through the above-described POR scheme.

Although the above examples use a particular number of bits and bytes, other numbers of bits or bytes can be used. Similarly, while a ratio of 1 redundant configuration wordline per 512 wordlines is used, other ratios are also permitted.

Figure 5:
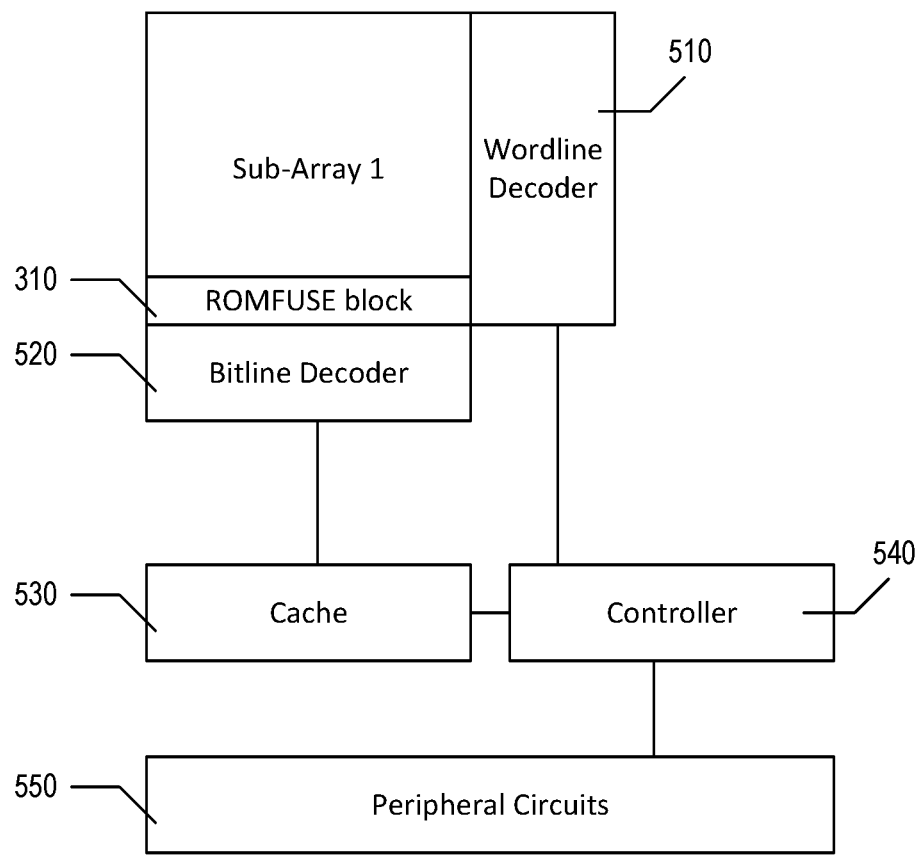
FIG. 5 illustrates a system for operation of a POR procedure, according to certain embodiments.

FIG. 5 illustrates a system for operation of a POR procedure, according to certain embodiments. As shown in FIG. 5, a sub-array 1 may be provided with a ROMFUSE block containing ROMFUSE data 310, as also illustrated above in FIG. 3. Furthermore, the sub-array 1 may be provided with a wordline decoder 510 and a bitline decoder 520. During the POR procedure, a controller 540 may use the wordline decoder 510 to select the ROMFUSE block containing ROMFUSE data 310 for reading. A bitline decoder 520 may provide one or more bits or bytes from ROMFUSE block containing ROMFUSE data 310 to a cache 530 of the controller 540.

The controller 540 may be variously implemented. For example, controller 540 may be implemented as a digital logic circuit. The controller 540 may be configured to read and write to sub-array 1, as well as other sub-arrays of the memory. The controller 540 may also be configured to control various peripheral circuits 550 of the memory. The controller 540 may configure the peripheral circuits 550 based on configuration information provided by ROMFUSE block containing ROMFUSE data 310.

Figure 6:
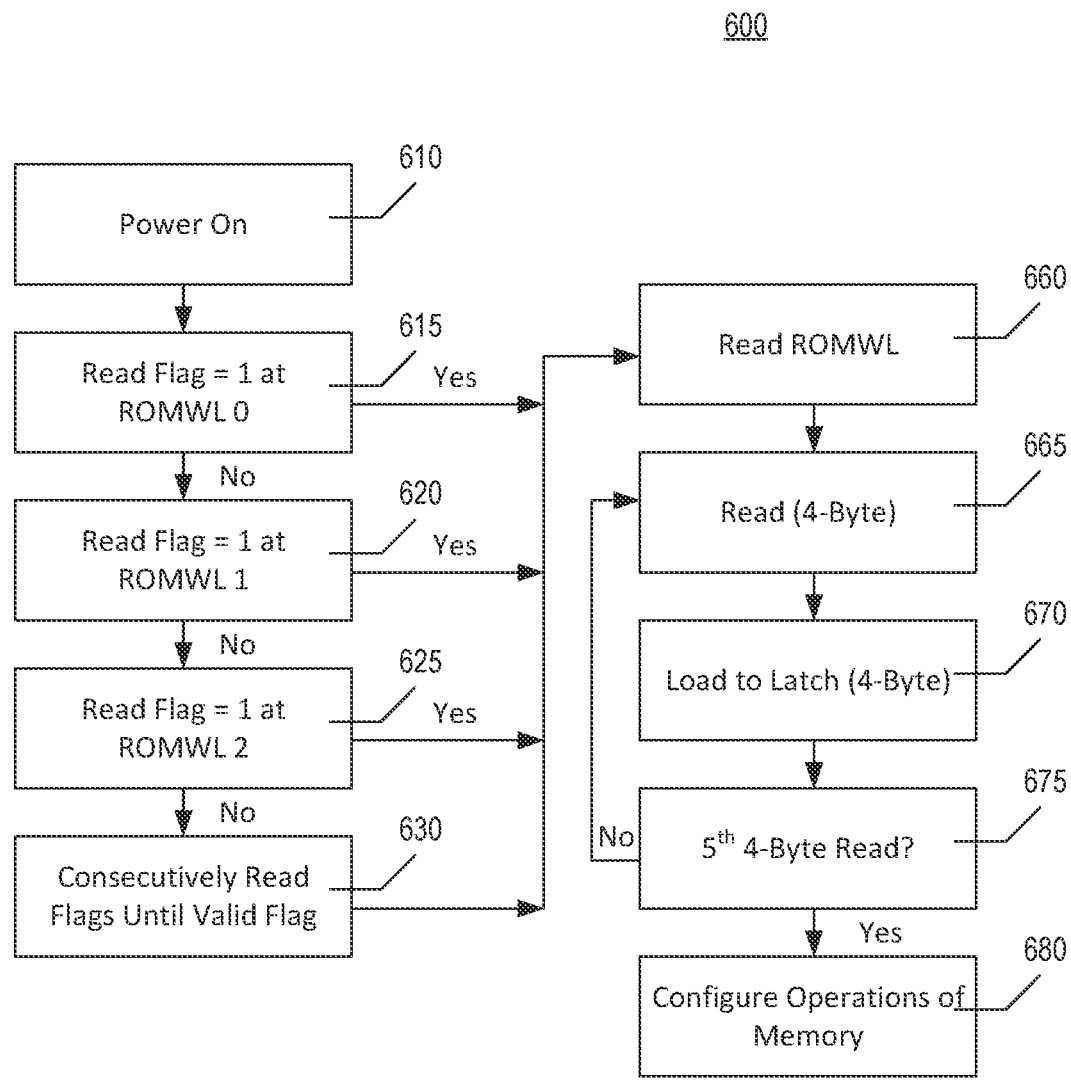
FIG. 6 illustrates a method according to certain embodiments of the present disclosure.

FIG. 6 illustrates a method according to certain embodiments of the present disclosure. As shown in FIG. 6, 1.a method 600 for power-on reset of a memory can begin by, at 610, powering on the memory. Method 600 can also include, at 615, reading a first flag in a first bit of a first configuration wordline of the memory. The first configuration wordline can be one of a plurality of redundant configuration wordlines. The first configuration wordline may be designated, for convenience, ROMWL 0. The first flag may indicate that the first configuration wordline is valid by being a logical one, rather than a logical zero. The configuration wordlines may contain ROMFUSE data in a ROMFUSE block. Step 615 in FIG. 6 may correspond to step 415 in FIG. 4.

Referring to FIG. 6, method 600 can also include, at 660, reading, when the first flag indicates the first configuration wordline is valid, a predetermined number of bytes of the wordline. The reading at 660 can be implemented by reading a four-byte section at 665, loading the section to latch at 670, determining whether a final (for example, fifth) four-byte section has been read, and if not, repeating the four-byte reading loop from 665 to 675 until the entire predetermined number of bytes is read. Once all the bytes are read, the method 600 can conclude by, at 680, configuring operations of the memory based on the predetermined number of bytes. This configuring can be performed based on the fact that the first flag indicates the first configuration wordline is valid.

In a further option, when the first flag indicates the first configuration wordline is invalid, method 600 can also include, at 620, reading a second flag in a first bit of a second configuration wordline of the memory. The second configuration wordline can also be one of the plurality of redundant configuration wordlines. The second configuration wordline may be designated, for convenience, ROMWL 1.

When the second flag indicates the second configuration wordline is valid, the method can proceed to, at 660, reading a predetermined number of bytes of the wordline and ultimately, at 680, configuring operations of the memory based on the predetermined number of bytes. As in the previous example, in this example the configuring can be based on the second flag indicating that the second configuration wordline is valid.

In a further option, when the second flag indicates the second configuration wordline is invalid, method 600 can include, at 625, reading a third flag in a first bit of a third configuration wordline of the memory. The third configuration wordline can also be one of the plurality of redundant configuration wordlines. The third configuration wordline may be designated, for convenience, ROMWL 2.

As shown at 630, the method can include consecutively reading a plurality of flags following the first flag until a flag indicating that a corresponding configuration wordline is valid. If all the flags are read and all are invalid, then the process may terminate as shown in FIG. 4, although not shown in this figure. The reason that this option is not shown in this figure, is that the redundancy provided by multiple ROMFUSE blocks containing ROMFUSE data stored in ROMWL of the memory may permit the power-on procedure to work in almost all cases.

As explained above, the first configuration wordline, the second configuration wordline, the third configuration wordline, and so on, may each be a ROMFUSE wordline. Each ROMFUSE wordline can contain ROMFUSE data in a ROMFUSE block.

As mentioned above, reading the predetermined number of bytes at 660 can include, at 665 through 675, reading four bytes at a time, five times. Other numbers of bytes can be used, and other amounts of simultaneous reading can be used. For example, five bytes could read four times to read the same number of bytes. Similarly, ten bytes could be read two times. One reason to select four bytes is that it is a power of two, and divides 20 bytes evenly.

The predetermined number of bytes can include bits for various data. For example, the bytes can include 1 bit for the flag, 3 bits for device user configuration, 3 bits for logic wordline enable 1 ns delay option, 88 bits for analog and array design option, 64 bits for redundancy content addressable memory, and 1 bit designated as unused. Other usages of the bits are also permitted.

As shown in FIG. 3, the memory can include a plurality of sectors each having a plurality of sub-arrays. Each sub-array can include a respective one of the plurality of redundant configuration wordlines. This may result in a predetermined ratio of configuration wordlines to total wordlines. For example, the memory may include one of the plurality of redundant configuration wordlines per 512 wordlines.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, the device comprising:
   a controller configured to control operation of the memory; and
   the memory comprising a plurality of redundant configuration wordlines,
   wherein the controller is configured to
      read a first flag in a first bit of a first redundant configuration wordline of the memory, wherein the first redundant configuration wordline is one of the plurality of redundant configuration wordlines;
      read, when the first flag indicates the first redundant configuration wordline is valid for reading a remainder of the first redundant configuration wordline, a predetermined number of bytes of the first redundant configuration wordline; and
      configure operations of the memory based on the predetermined number of bytes, when the first flag indicates the first redundant configuration wordline is valid, wherein the operations comprise enabling or disabling an option regarding the remainder of the first redundant configuration wordline.

2. The memory device of claim 1, wherein the controller is further configured to read, when the first flag indicates the first redundant configuration wordline is invalid, a second flag in a first bit of a second redundant configuration wordline of the memory, wherein the second redundant configuration wordline is also one of the plurality of redundant configuration wordlines.

3. The memory device of claim 2, wherein the controller is further configured to read, when the second flag indicates the second redundant configuration wordline is valid, a predetermined number of bytes of the second redundant configuration wordline; and
   configure operations of the memory based on the predetermined number of bytes, when the second flag indicates the second redundant configuration wordline is valid.

4. The memory device of claim 3, wherein the controller is further configured to read, when the second flag indicates the second redundant configuration wordline is invalid, a third flag in a first bit of a third redundant configuration wordline of the memory, wherein the third redundant configuration wordline is also one of the plurality of redundant configuration wordlines.

5. The memory device of claim 1, wherein the controller is configured to read a plurality of flags following the first flag consecutively until a flag indicating that a corresponding redundant configuration wordline is valid.

6. The memory device of claim 1, wherein the first redundant configuration wordline comprises a ROMFUSE wordline.

7. The memory device of claim 1, wherein the controller is configured to read the predetermined number of bytes by reading four bytes at a time, five times.

8. A memory device, the device comprising:
   a controller configured to control operation of the memory; and
   the memory comprising a plurality of redundant configuration wordlines,
   wherein the controller is configured to
      read a first flag in a first bit of a first redundant configuration wordline of the memory, wherein the first redundant configuration wordline is one of the plurality of redundant configuration wordlines;
      read, when the first flag indicates the first redundant configuration wordline is valid, a predetermined number of bytes of the first redundant configuration wordline; and
      configure operations of the memory based on the predetermined number of bytes, when the first flag indicates the first redundant configuration wordline is valid,
   wherein the predetermined number of bytes comprise 1 bit for the flag, 3 bits for device user configuration, 3 bits for logic wordline enable ins delay option, 88 bits for analog and array design option, 64 bits for redundancy content addressable memory, and 1 bit designated as unused.

9. The memory device of claim 1, wherein the memory comprises a plurality of sectors each having a plurality of sub-arrays, wherein each sub-array comprises a respective one of the plurality of redundant configuration wordlines.

10. The memory device of claim 1, wherein the memory comprises one of the plurality of redundant configuration wordlines per 512 wordlines.

11. A memory controller, comprising:
    a digital logic circuit configured to control operation of a memory,
    wherein the digital logic circuit is configured to
       read a first flag in a first bit of a first redundant configuration wordline of the memory, wherein the first redundant configuration wordline is one of the plurality of redundant configuration wordlines;
       read, when the first flag indicates the first redundant configuration wordline is valid for reading a remainder of the first redundant configuration wordline, a predetermined number of bytes of the first redundant configuration wordline; and configure operations of the memory based on the predetermined number of bytes, when the first flag indicates the first redundant configuration wordline is valid, wherein the operations comprise enabling or disabling an option regarding the remainder of the first redundant configuration wordline.

12. The memory controller of claim 11, wherein the digital logic circuit is further configured to read, when the first flag indicates the first redundant configuration wordline is invalid, a second flag in a first bit of a second redundant configuration wordline of the memory, wherein the second redundant configuration wordline is also one of the plurality of redundant configuration wordlines.

13. The memory controller of claim 12, wherein the digital logic circuit is further configured to read, when the second flag indicates the second redundant configuration wordline is valid, a predetermined number of bytes of the second redundant configuration wordline; and configure operations of the memory based on the predetermined number of bytes, when the second flag indicates the first redundant configuration wordline is valid.

14. The memory controller of claim 13, wherein the digital logic circuit is further configured to read, when the second flag indicates the second redundant configuration wordline is invalid, a third flag in a first bit of a third redundant configuration wordline of the memory, wherein the third redundant configuration wordline is also one of the plurality of redundant configuration wordlines.

15. The memory controller of claim 11, wherein the digital logic circuit is configured to read a plurality of flags following the first flag consecutively until a flag indicating that a corresponding redundant configuration wordline is valid.

16. The memory controller of claim 11, wherein the first redundant configuration wordline comprises a ROMFUSE wordline.

17. The memory controller of claim 11, wherein the digital logic circuit is configured to read the predetermined number of bytes by reading four bytes at a time, five times.

18. A memory controller, comprising:

a digital logic circuit configured to control operation of a memory, wherein the digital logic circuit is configured to read a first flag in a first bit of a first redundant configuration wordline of the memory, wherein the first redundant configuration wordline is one of the plurality of redundant configuration wordlines;

read, when the first flag indicates the first redundant configuration wordline is valid, a predetermined number of bytes of the first redundant configuration wordline; and configure operations of the memory based on the predetermined number of bytes, when the first flag indicates the first redundant configuration wordline is valid, wherein the predetermined number of bytes comprise 1 bit for the flag, 3 bits for device user configuration, 3 bits for logic wordline enable Ins delay option, 88 bits for analog and array design option, 64 bits for redundancy content addressable memory, and 1 bit designated as unused.

19. The memory device of claim 1, wherein the operations of the memory comprise identifying content as addressable or unaddressable.

20. The memory device of claim 1, wherein the operations are identified with ROMFUSE data.

21. The memory device of claim 1, wherein the operations are controlled by a device user configuration.

22. The memory device of claim 1, wherein the operations comprise enabling a delay option.

23. The memory controller of claim 11, wherein the operations of the memory comprise identifying content as addressable or unaddressable.

24. The memory controller of claim 11, wherein the operations are identified with ROMFUSE data.

25. The memory controller of claim 11, wherein the operations are controlled by a device user configuration.

26. The memory controller of claim 11, wherein the operations comprise enabling a delay option.

* * * * *